United States Patent [19]

DiCicco

[11] Patent Number: 4,520,834
[45] Date of Patent: Jun. 4, 1985

[54] APPARATUS FOR PROCESSING ARTICLES IN A SERIES OF PROCESS SOLUTION CONTAINERS

[76] Inventor: Paolo S. DiCicco, 395 Laurel St., San Carlos, Calif. 94070

[21] Appl. No.: 549,990

[22] Filed: Nov. 8, 1983

[51] Int. Cl.³ .............................................. B08B 3/10
[52] U.S. Cl. ........................................ 134/63; 134/76
[58] Field of Search ............... 134/18, 25.4, 33, 56 R, 134/57 R, 76, 77, 63

[56] References Cited

U.S. PATENT DOCUMENTS

| | | | |
|---|---|---|---|
| 2,416,475 | 2/1947 | Friedman | 134/76 X |
| 2,701,575 | 2/1955 | Friedman | 134/77 X |
| 2,709,010 | 5/1955 | Todd | 134/77 X |
| 2,886,046 | 5/1959 | Gal | 134/77 X |
| 3,489,608 | 1/1970 | Jacobs et al. | 134/33 X |
| 3,674,040 | 7/1972 | Howells et al. | 134/58 |
| 3,869,313 | 3/1975 | Jones et al. | 134/76 X |
| 3,903,908 | 9/1975 | Logue et al. | 134/57 |
| 4,027,686 | 6/1977 | Shortes et al. | 134/33 |
| 4,221,533 | 9/1980 | Heim et al. | 414/744 |
| 4,264,266 | 4/1981 | Trechsel | 414/730 |

*Primary Examiner*—Marc L. Caroff
*Attorney, Agent, or Firm*—Flehr, Hohbach, Test, Albritton & Herbert

[57] ABSTRACT

An apparatus is provided wherein solid material, such as semiconductor wafers, are sequentially transported into and out of a series of process solution containers. Process solution from each container and particulate matter is removed from the material by providing means for rotating the material in a vertical plane above each container. The apparatus includes a housing maintained substantially free of particulate matter.

2 Claims, 6 Drawing Figures

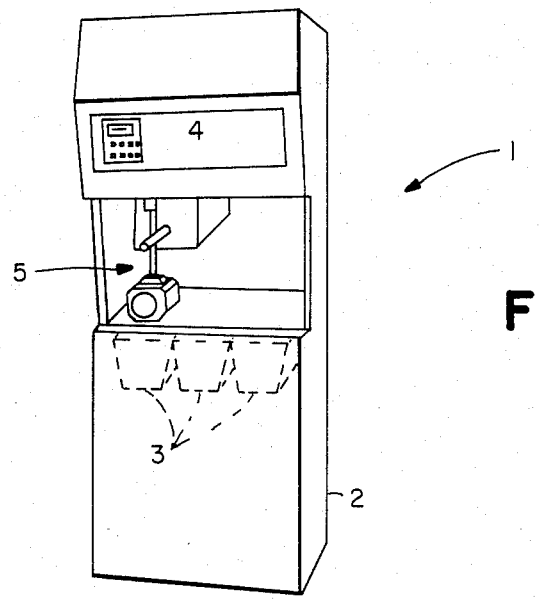
FIG.—1
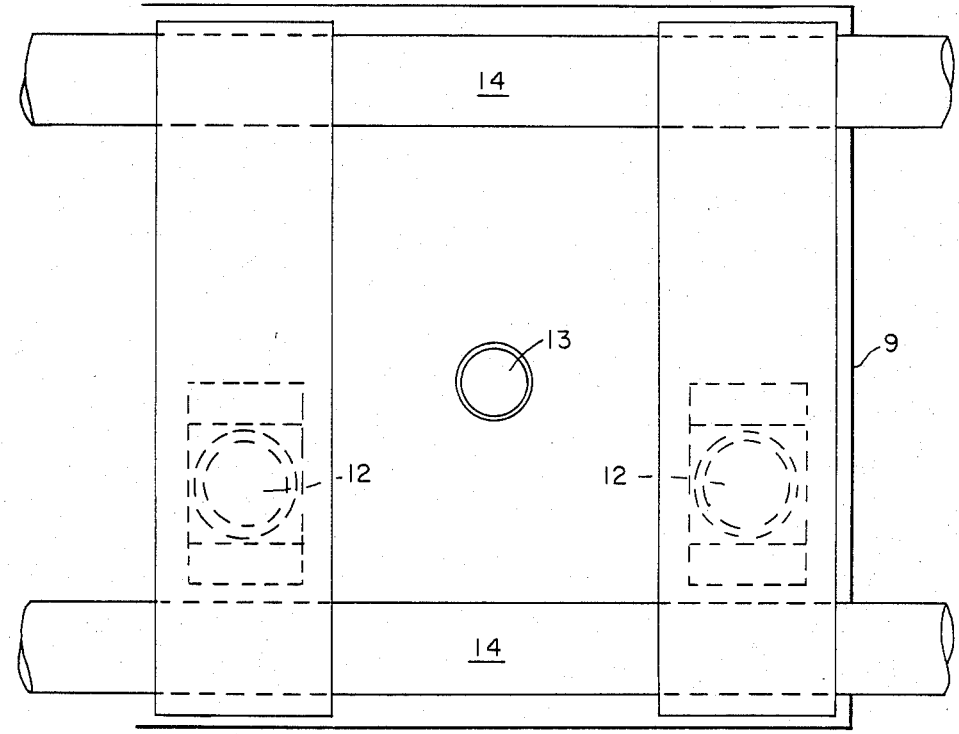
FIG.—3

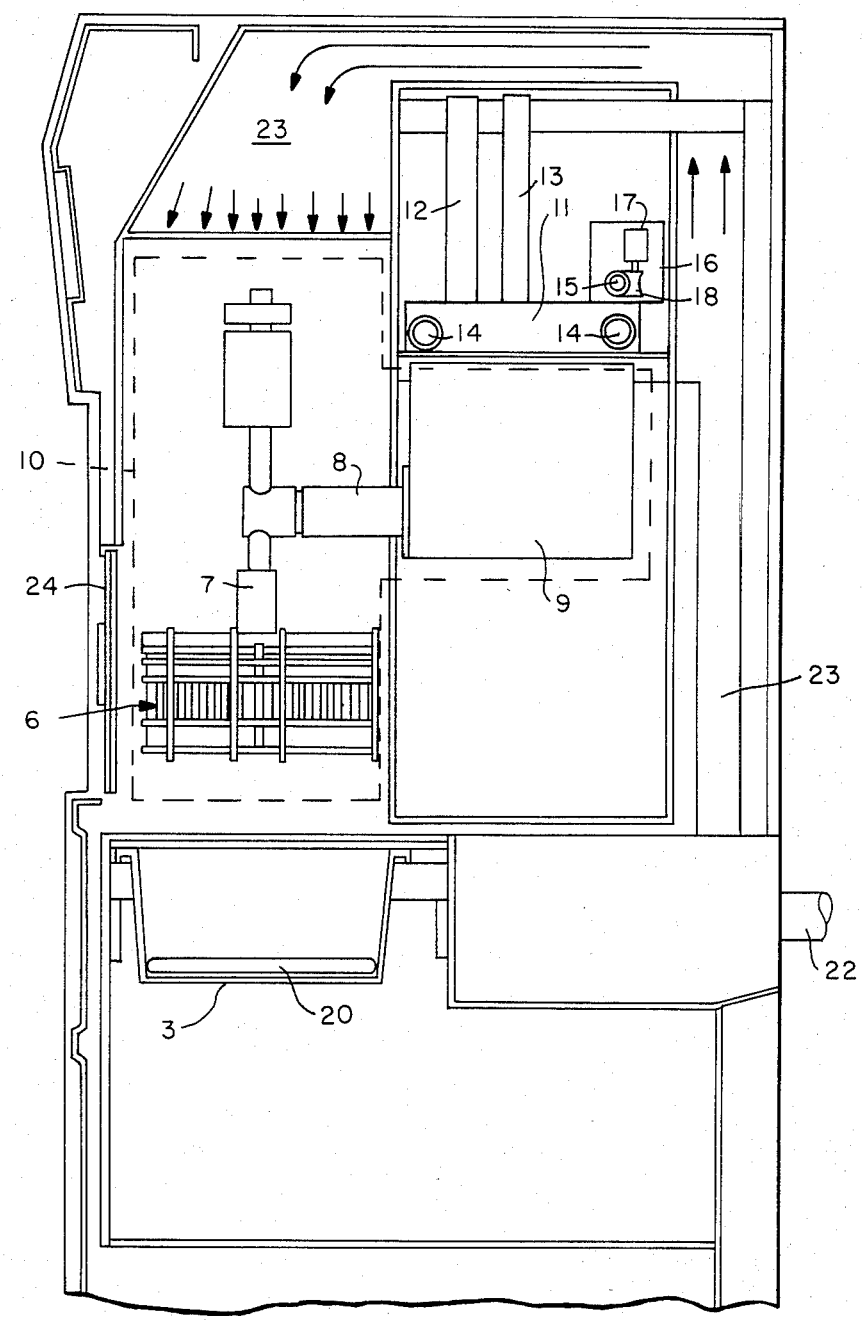
FIG.—2a

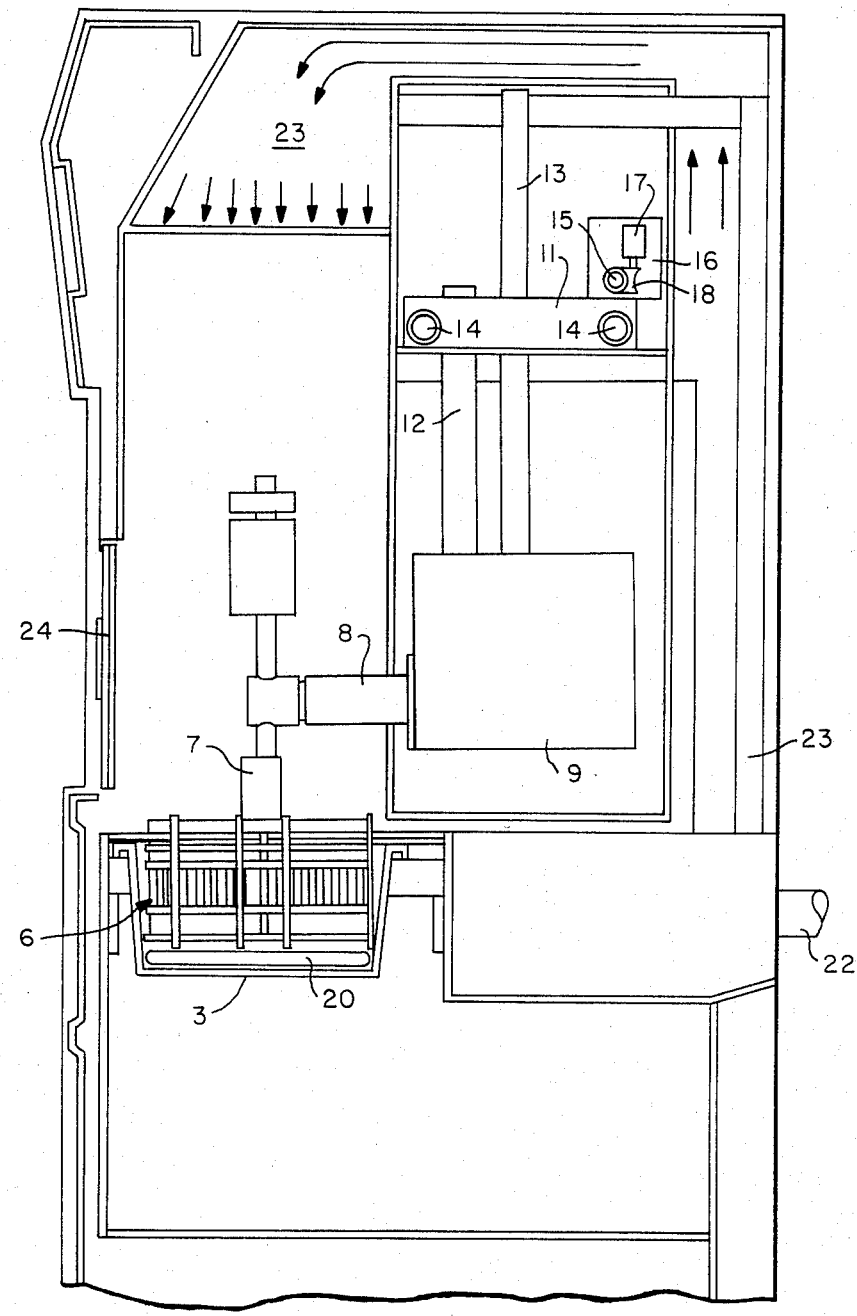
FIG.—2b

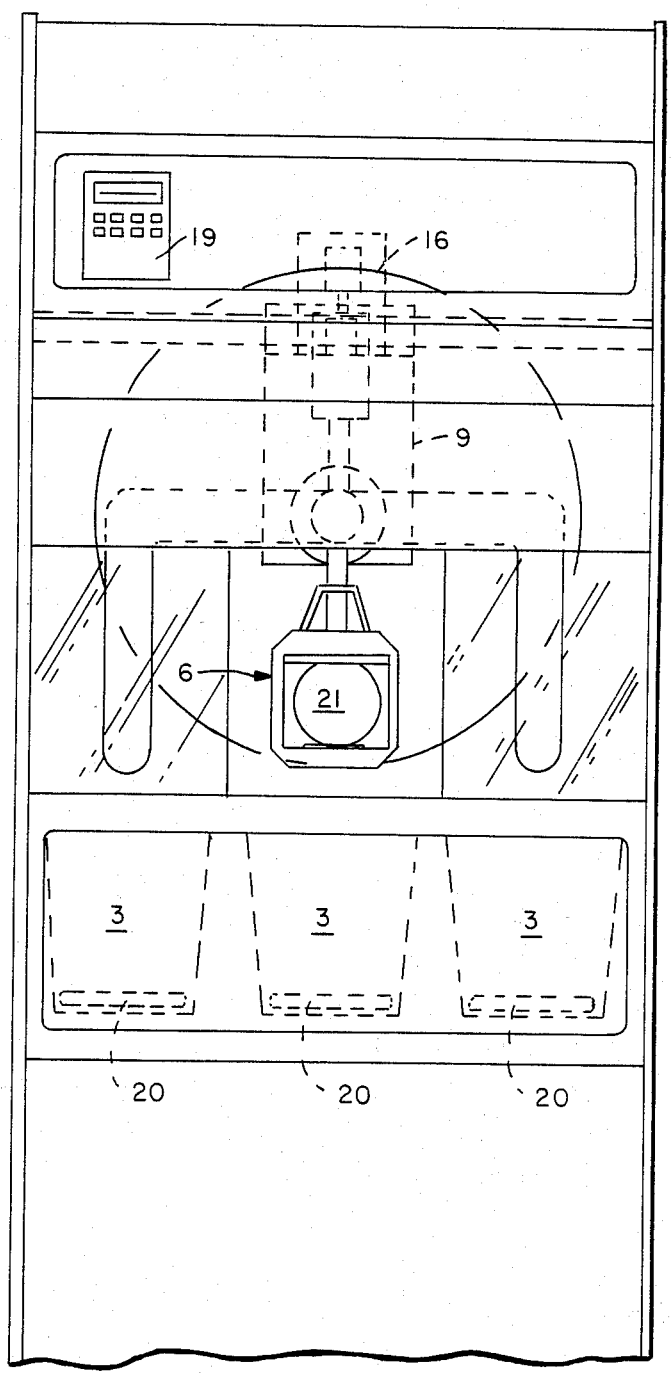
FIG.— 4

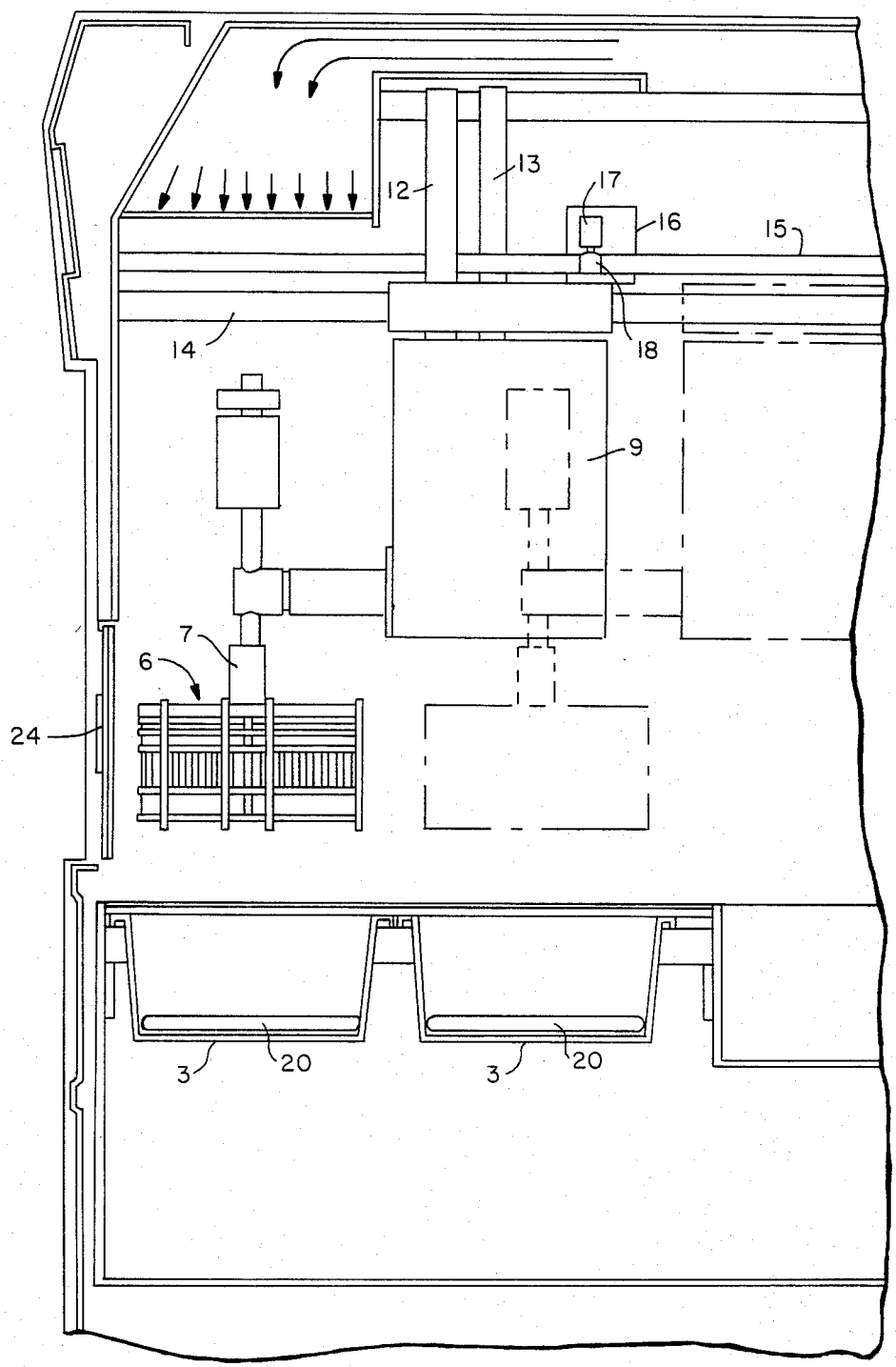
FIG.—5

APPARATUS FOR PROCESSING ARTICLES IN A SERIES OF PROCESS SOLUTION CONTAINERS

BACKGROUND OF THE INVENTION

This invention is directed to an apparatus and method for the wet processing of solid materials wherein the material may be automatically and sequentially subjected to a plurality of processing solutions or washes. More particularly, the present invention is directed to the automated wet processing of wafers used in the semiconductor industry.

The fabrication of semiconductor devices typically involves many different types of processes. Photolithographic techniques utilize solutions to develop photo resist patterns and to chemically etch the exposed wafer surface. In addition, thin film deposition on wafer surfaces can be accomplished by electroplating or chemical-reduction plating from solution. Successful fabrication requires precise control over such processes as well as quality control over the presence of particulates which contribute to device failure.

Devices for the automatic movement of solid materials through a series of process stations are known. For example, U.S. Pat. Nos. 2,534,338 and 3,335,839 disclose apparatus for transferring racks to a series of treating stations.

However, such apparatus do not provide a centrifugal drying means to ensure that the treated material is free from particulate or liquid matter between successive treatment stations.

In the semiconductor industry, the movement of wafers through wet process stations is performed primarily by human operators. This introduces the possibility of operator error affecting the time the wafers are exposed to process solutions, variation in the drying time before the wafers are exposed to the next process, contamination of the process solutions and physical damage to the wafers. Additionally, human manipulation introduces the potential for contamination of the wafers by operator particulates.

There is a need, therefore, for an apparatus and method whereby the sequential wet processing of solid materials, particularly, semiconductor wafers, may be performed with a high degree of reproducibility in a environment where particulate contamination may be substantially eliminated.

Accordingly, an object of the present invention is to provide methods and means for automated sequential wet processing of solid material which have a high level of reproducibility through the elimination of operator error and contamination by operator particulates.

A further object of the present invention is to provide methods and means whereby process solutions may be quickly removed from the materials being processed to facilitate uniformity in the process and the minimization of contamination of subsequent process solutions.

Still further, an object of the present invention is to provide methods and means whereby automated sequential wet processing may be interfaced with automated loading-unloading devices and transport systems.

SUMMARY OF THE INVENTION

In general, the present invention provides means and methods for the automated sequential wet processing of solid material. Methods and means are disclosed whereby solid material is sequentially contacted with a plurality of processing liquids, whereby subsequent to contact with each liquid, the solid material is substantially dried and made free of particular contaminants by centrifugation. The centrifugal force is generated by the rotation of a rotor which has attached at one end a carrier containing the solid material. The rotor-carrier assembly also functions to contain the solid material during contact with the process solutions. In one embodiment, the rotor-carrier assembly in conjunction with transport and positioning means can be used as a robot arm to automatically and sequentially contact the solid material with the process solutions. An advantage of the present invention is that the entire wet processing may be carried out by automated means whereby the solid material is uniformly processed and spun dry in an environment adapted to prevent particulate contamination.

Additional features of the invention will be evident from the following description taken in conjunction with the accompanying drawings.

FIG. 1 is a view of the device constructed in accordance with the preferred embodiment of the present invention.

FIG. 2(a) is a sectional side-view of the apparatus showing the apparatus in the spin position.

FIG. 2(b) is a sectional side-view of the apparatus showing the apparatus in the processing position.

FIG. 3 is a top view of the carrier showing the engagement of horizontal and vertical positioning means.

FIG. 4 is a front-sectional view of the apparatus in the spin position.

FIG. 5 is a side-sectional view of an alternate embodiment of the present invention.

DETAILED DESCRIPTION OF A PREFERRED EMBODIMENT

A preferred embodiment of the present invention is presented in FIG. 1. Automated wafer processor 1, consists of a frame and body 2, which houses processing tanks 3, automated control means 4, and means 5 for containing and manipulating the wafers during processing.

In FIG. 2(a) carrier 6 is attached to rotor 7, which in turn is attached to rotor drive shaft 8. A drive motor (not shown) is contained in motor housing 9 and is connected to rotor drive shaft 8. The carrier 6, rotor 7, rotor drive shaft 8 and motor housing 9 together comprise the rotor assembly 10.

Rotor assembly 10 engages carrier 11 with two vertical linear shafts 12 which are attached to the top of motor housing 9. Shafts 12 are free to slide up and down in relation to carriage 11 and provide means for raising and lowering rotor assembly 10. Such means also include pneumatic cylinder 13 which is attached to motor housing 9 and controls the vertical movement and positon of rotor assembly 10. In this manner, carrier 6 containing the material to be processed can be emersed in tank 3 as shown in FIG. 2b and removed from tank 3 as shown in FIG. 2a.

Carriage 11 is also engaged by two horizontal liner shafts 14, as shown in FIGS. 2 and 3. Shafts 14 are attached to the frame and body 2 of processor 1. Engagement is such that carriage 11 can be moved in a horizontal direction. Horizontal control shaft 15 is attached to the frame and body 2 of the processsor 1 and engages the motor housing 9 through horizontal control drive 16 which consists of a reversible motor drive 17 connected to drive contact 18. Horizontal control drive 16 causes the carriage 11 and rotor assembly 10 to move in the horizontal direction. In this manner carrier 6 can be positioned over different tanks containing process solutions.

The wet processing of the solid material is controlled by the programmable sequence controller 19 in FIG. 4. Such controllers are conventional and may be obtained, for example, from CCI (Sunnyvale, Calif.). Controller 19 maintains the temperature of the process solutions through heating elements 20, chooses the first process solution by moving carriage 11 to position carrier 6 above the appropriate tank, controls the time of contact between process solution and solid material by lowering and raising rotor assembly 10, and removes the first process solution by first positioning the rotor assembly 10 in the spin position depicted in FIG. 4, followed by activating the rotor drive motor for a predetermined time. When so activated, rotor 7 and carrier 6 spin in the vertical plane depicted in FIG. 4. The solid material contained in carrier 6 experiences a centrifugal force which causes the solid material to shed the process solution. The solid material in carrier 6 also encounters an air mass having a velocity component which aids in the shedding of process solution and the drying of the processed material. After spinning the rotor is aligned in the vertical position as depicted in FIG. 4. Controller 19 then positions the rotor assembly 10 over a tank containing a second process solution and repeats the procedure with time intervals appropriate for the second process solution.

In processing semiconductor wafers, the wafers 21 are mounted in a boat, which when inserted into carrier assembly 6, positions the wafers so that the faces of the wafers are parallel to the plane of rotation. This allows quick and efficient wetting by process solutions and efficient removal of such solutions when the wafers are spin dried.

Contamination of process solutions can be prevented by automatic retractable tank covers (not shown) or by employing an alternate embodiment as depicted in FIG. 5. In FIG. 5, horizontal linear shafts 14, horizontal control shaft 15, and the process solutions are arranged in a direction perpendicular to the plane of rotor rotation. When so arranged, the rotor can be spun directly over the tank from which the carrier assembly has been withdrawn. This arrangement effectively minimizes cross contamination between process solutions.

The dimensions of an apparatus embodying this invention, as well as the materials used in its construction, will depend upon the nature of the material to be processed and the process employed. A wide variation in construction design is therefore contemplated by the present invention. It is evident, therefore, that there are many other embodiments which are possible. For example, automated horizontal positioning can be achieved by maintaining the rotor assembly's horizontal position and moving the tanks beneath the carrier 6. Likewise, automated vertical movement can be achieved by raising and lowering tanks 3 by appropriate means. Further, a two-dimensional array of tanks containing process solutions can be employed with the present invention by introducing two-dimensional horizontal positioning means known by those in the art.

Although the preferred embodiment describes the processing of wafers used in semiconductor fabrication, the invention is not intended to be so limited. Other uses include the cleaning, etching, and drying of other small parts, including computer disc drives and assembled electronic devices. The present invention is thus applicable to any sequential wet processing of solid material.

Other features of the embodiment disclosed include means to control the air to which the processed material is contacted. Air inlet port 22 and air conduction channel 23 in FIG. 2 allow the introduction of air (or inert gas, such as nitrogen) substantially free of particulate matter. Additionally, the gases so introduced can be varied to generate an inert or reactive gas phase. An automatic operator free interface (not shown) with a loader-unloader may also be coupled to the automated process system according to the present invention. Such interface may be effected by a means for automatic loading and unloading of carrier 6 through orifice 24.

Having described the preferred embodiment of the present invention, it will occur to those ordinarily skilled in the art that various modifications may be made to the disclosed embodiment, and such modifications are intended to be within the scope of the present invention.

What is claimed is:

1. An apparatus in an enclosed housing for the processing of solid materials comprising:
    (a) a carrier for containing said solid materials, said carrier affixed to an end of a rotor arm;
    (b) a plurality of containers horizontally affixed to a base;
    (c) vertical traversing means for raising and lowering said carrier from and into each said container, said vertical traversing means comprising a first carriage attached to said rotor arm and engaged to moveable vertical shafts;
    (d) horizontal traversing means for positioning said rotor arm and carrier above each of said containers, said horizontal traversing means comprising a second carriage moveably engaged to fixed horizontal shafts and to said vertical shafts;
    (e) drive means for rotating said rotor arm and carrier in a vertical plane within said housing whereby said carrier and solid materials contained therein are subjected to centrifugal force;
    (f) means for moving sequentially said second carriage to a preselected sequence of positions along said horizontal shafts;
    (g) means for timing preselected periods during which said carrier remains lowered in each said container; and
    (h) means for timing a preselected period of rotation of said rotor arm at a preselected rotational frequency subsequent to raising said carrier from each said container.

2. An apparatus according to claim 1 wherein said housing accommodates means for introducing gases substantially free of particulate matter and for containing within said housing substances which are thrown from said rotor arm and said carrier during rotation thereof.

* * * * *